US010346573B1

(12) United States Patent
Sharma et al.

(10) Patent No.: US 10,346,573 B1
(45) Date of Patent: Jul. 9, 2019

(54) METHOD AND SYSTEM FOR PERFORMING INCREMENTAL POST LAYOUT SIMULATION WITH LAYOUT EDITS

(71) Applicant: Cadence Design Systems, Inc., San Jose, CA (US)

(72) Inventors: Karun Sharma, San Jose, CA (US); Roland Ruehl, San Carlos, CA (US); Arnold Ginetti, Antibes (FR); Srihari Sampath, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 42 days.

(21) Appl. No.: 14/871,929

(22) Filed: Sep. 30, 2015

(51) Int. Cl.
*G06F 17/50* (2006.01)

(52) U.S. Cl.
CPC ...... *G06F 17/5072* (2013.01); *G06F 17/5009* (2013.01); *G06F 17/5022* (2013.01); *G06F 17/5045* (2013.01); *G06F 17/5068* (2013.01); *G06F 17/5081* (2013.01); *G06F 2217/04* (2013.01); *G06F 2217/08* (2013.01)

(58) Field of Classification Search
CPC ............. G06F 17/5081; G06F 17/5068; G06F 17/5022; G06F 17/5045; G06F 17/5009; G06F 2217/08; G06F 2217/04; G06F 17/5072; G06F 9/455; G06F 11/261; G06F 17/211
See application file for complete search history.

(56) References Cited

U.S. PATENT DOCUMENTS

| | | | | |
|---|---|---|---|---|
| 3,715,573 A * | 2/1973 | Vogelsberg | ........... | G06F 11/261 714/33 |
| 5,222,030 A * | 6/1993 | Dangelo | .......... | G01R 31/31704 703/15 |
| 5,663,889 A * | 9/1997 | Wakita | ................ | G06F 17/5022 716/108 |
| 5,799,172 A * | 8/1998 | Gullapalli | ........... | G06F 17/5036 703/14 |
| 5,867,399 A * | 2/1999 | Rostoker | .......... | G01R 31/31704 714/E11.167 |
| 6,045,252 A * | 4/2000 | Pedersen | ............. | G06F 17/5072 716/125 |
| 6,077,310 A * | 6/2000 | Yamamoto | ................ | G03F 1/36 430/30 |
| 6,311,309 B1 * | 10/2001 | Southgate | .......... | G01R 31/3177 703/13 |
| 6,321,363 B1 * | 11/2001 | Huang | ................ | G06F 17/5022 703/16 |
| 6,378,116 B1 | 4/2002 | Ginetti | | |

(Continued)

FOREIGN PATENT DOCUMENTS

WO    WO2009070177 A1    6/2009

*Primary Examiner* — Helen Rossoshek
(74) *Attorney, Agent, or Firm* — Vista IP Law Group, LLP

(57) ABSTRACT

An improved method, system, and computer program product to perform post-layout simulation of an electronic design is provided. According to one approach, a circuit design is divided into multiple partitions for simulation. Simulation is then performed using the established partitions and results are obtained for the different partitions. When any layout editing occurs, identification can be made of any partitions that have been affected by the editing. The affected partitions are re-processed for simulation. The unaffected partitions do not necessarily need to be reprocessed.

20 Claims, 14 Drawing Sheets

(56) References Cited

U.S. PATENT DOCUMENTS

| | | | |
|---|---|---|---|
| 6,405,345 B1 | 6/2002 | Ginetti | |
| 6,519,743 B1 | 2/2003 | Nauts et al. | |
| 6,622,290 B1 | 9/2003 | Ginetti et al. | |
| 6,622,291 B1 | 9/2003 | Ginetti | |
| 6,735,742 B2 * | 5/2004 | Hatsch | G06F 17/5045 257/E27.105 |
| 6,754,763 B2 * | 6/2004 | Lin | G06F 15/7864 361/748 |
| 6,847,926 B1 * | 1/2005 | Ballam | G06F 17/5022 703/14 |
| 6,865,726 B1 * | 3/2005 | Igusa | G06F 17/5045 700/97 |
| 6,877,667 B1 * | 4/2005 | Angle | H01L 27/11807 235/375 |
| 7,047,510 B1 * | 5/2006 | Chopra | G06F 17/504 716/106 |
| 7,127,384 B2 * | 10/2006 | Zolotov | G06F 17/5036 703/14 |
| 7,131,100 B2 * | 10/2006 | Lin | G03F 1/36 382/144 |
| 7,203,914 B2 * | 4/2007 | Wood | G06F 17/5036 716/113 |
| 7,269,541 B1 * | 9/2007 | McGaughy | G06F 17/5022 703/14 |
| 7,367,006 B1 * | 4/2008 | O'Riordan | G06F 17/5045 716/102 |
| 7,409,656 B1 | 8/2008 | Ruehl | |
| 7,412,676 B2 * | 8/2008 | Cobb | G06F 17/5081 716/106 |
| 7,424,690 B2 * | 9/2008 | Schultz | G06F 17/5036 716/106 |
| 7,434,185 B2 * | 10/2008 | Dooling | G06F 17/5081 716/106 |
| 7,434,188 B1 * | 10/2008 | Devgan | G06F 17/5072 716/119 |
| 7,555,739 B1 | 6/2009 | Ginetti et al. | |
| 7,571,086 B2 * | 8/2009 | Chang | G06F 17/5022 703/14 |
| 7,613,599 B2 * | 11/2009 | Bade | G06F 17/5022 703/14 |
| 7,634,743 B1 | 12/2009 | Ginetti | |
| 7,657,856 B1 | 2/2010 | Koshy et al. | |
| 7,669,175 B2 * | 2/2010 | Culp | G06F 17/5068 430/30 |
| 7,689,948 B1 | 3/2010 | White et al. | |
| 7,707,528 B1 | 4/2010 | White et al. | |
| 7,721,234 B2 * | 5/2010 | Lee | G06F 17/5036 703/13 |
| 7,725,845 B1 | 5/2010 | White et al. | |
| 7,761,828 B2 * | 7/2010 | Miczo | G06F 17/5022 703/13 |
| 7,886,243 B1 | 2/2011 | Gumaste et al. | |
| 7,895,027 B2 * | 2/2011 | Lin | G06F 17/5022 703/14 |
| 7,904,852 B1 | 3/2011 | Cadouri et al. | |
| 7,949,987 B1 | 5/2011 | Ginetti et al. | |
| 7,971,175 B2 | 6/2011 | Ginetti et al. | |
| 7,971,178 B1 | 6/2011 | Marwah et al. | |
| 7,984,399 B1 | 7/2011 | Ruehl et al. | |
| 7,987,084 B2 * | 7/2011 | MacLean | G06F 17/5081 703/13 |
| 8,046,730 B1 | 10/2011 | Ferguson et al. | |
| 8,069,024 B1 * | 11/2011 | Croix | G06F 17/5036 703/14 |
| 8,160,856 B2 * | 4/2012 | Moorby | G06F 17/5022 703/13 |
| 8,195,439 B1 * | 6/2012 | Hussain | G06F 17/5036 703/14 |
| 8,201,121 B1 * | 6/2012 | Sankaralingam | G06F 17/5045 716/109 |
| 8,234,617 B2 * | 7/2012 | Chetput | G06F 17/5022 716/106 |
| 8,255,845 B2 | 8/2012 | Ginetti | |
| 8,281,272 B1 | 10/2012 | Ginetti | |
| 8,316,342 B1 * | 11/2012 | Kukal | G06F 17/5045 703/13 |
| 8,326,591 B1 * | 12/2012 | Cai | G06F 17/5036 703/13 |
| 8,352,893 B1 * | 1/2013 | Lin | G06F 17/5081 716/104 |
| 8,448,096 B1 | 5/2013 | Wang et al. | |
| 8,453,136 B1 | 5/2013 | Hahn et al. | |
| 8,468,482 B1 * | 6/2013 | Pack | G06F 17/5036 716/110 |
| 8,473,874 B1 | 6/2013 | Sharma et al. | |
| 8,490,038 B1 | 7/2013 | Arora et al. | |
| 8,516,399 B2 * | 8/2013 | Paris | G06F 17/5081 716/136 |
| 8,516,404 B1 | 8/2013 | Cao et al. | |
| 8,521,483 B1 * | 8/2013 | Kukal | G06F 17/5022 703/19 |
| 8,572,532 B1 * | 10/2013 | Singh | G06F 17/505 716/107 |
| 8,594,988 B1 | 11/2013 | Spyrou et al. | |
| 8,645,902 B1 | 2/2014 | Yu et al. | |
| 8,694,943 B1 | 4/2014 | Yu et al. | |
| 8,713,498 B2 * | 4/2014 | Shroff | G06F 17/5081 716/110 |
| 8,719,754 B1 | 5/2014 | Ginetti | |
| 8,806,405 B2 | 8/2014 | Colwell et al. | |
| 8,807,948 B2 | 8/2014 | Luo et al. | |
| 8,898,618 B2 * | 11/2014 | Chin | G06F 3/0482 703/13 |
| 8,910,100 B1 | 12/2014 | Wilson et al. | |
| 9,064,063 B1 | 6/2015 | Yu et al. | |
| 9,092,586 B1 | 7/2015 | Ginetti et al. | |
| 9,117,052 B1 | 8/2015 | Salowe et al. | |
| 9,141,746 B1 | 9/2015 | Ginetti et al. | |
| 9,164,969 B1 | 10/2015 | Gumaste et al. | |
| 9,223,915 B1 * | 12/2015 | Ginetti | G06F 17/5022 |
| 9,256,708 B2 | 2/2016 | Sharma | |
| 9,348,957 B1 * | 5/2016 | Liu | G06F 17/5036 |
| 9,348,960 B1 * | 5/2016 | Ginetti | G06F 17/5022 |
| 9,372,955 B1 | 6/2016 | Lee et al. | |
| 9,384,317 B1 | 7/2016 | Salowe et al. | |
| 9,396,301 B1 | 7/2016 | Lee et al. | |
| 9,563,737 B1 | 2/2017 | Arkhipov et al. | |
| 9,652,579 B1 | 5/2017 | Arkhipov et al. | |
| 9,659,138 B1 | 5/2017 | Powell et al. | |
| 2002/0049576 A1 * | 4/2002 | Meyer | G06F 17/5036 703/14 |
| 2003/0140337 A1 * | 7/2003 | Aubury | G06F 11/3409 717/158 |
| 2006/0010409 A1 * | 1/2006 | Tamaki | G06F 17/5031 716/113 |
| 2007/0233439 A1 * | 10/2007 | Carroll | G06F 17/5022 703/6 |
| 2008/0072182 A1 * | 3/2008 | He | G06F 17/504 716/113 |
| 2010/0023308 A1 * | 1/2010 | Willis | G06F 17/5036 703/13 |
| 2010/0115207 A1 | 5/2010 | Arora et al. | |
| 2011/0061034 A1 | 3/2011 | Ginetti et al. | |
| 2011/0161899 A1 | 6/2011 | Ginetti et al. | |
| 2011/0219341 A1 | 9/2011 | Cao et al. | |
| 2011/0307233 A1 * | 12/2011 | Tseng | G06F 17/5022 703/14 |
| 2012/0047434 A1 | 2/2012 | Ginetti | |
| 2012/0210295 A1 * | 8/2012 | Crisp | G06F 8/10 717/105 |
| 2013/0191054 A1 * | 7/2013 | Cho | G01R 22/00 702/61 |
| 2013/0246900 A1 | 9/2013 | Ginetti et al. | |
| 2013/0290834 A1 | 10/2013 | Ginetti et al. | |
| 2013/0290919 A1 * | 10/2013 | Narayanaswamy | G06F 17/5009 716/106 |
| 2015/0254392 A1 * | 9/2015 | Onodera | G06F 17/5081 716/114 |

(56) References Cited

U.S. PATENT DOCUMENTS

| | | | |
|---|---|---|---|
| 2015/0331981 A1* | 11/2015 | Mulvaney | G06F 17/5031 716/134 |
| 2015/0363527 A1* | 12/2015 | McGaughy | G06F 17/5009 703/2 |
| 2016/0314228 A1* | 10/2016 | James | G06F 17/5036 |
| 2017/0193139 A1* | 7/2017 | Kuo | G06F 17/5045 |

\* cited by examiner

METHOD AND SYSTEM FOR PERFORMING INCREMENTAL POST LAYOUT SIMULATION WITH LAYOUT EDITS

FIELD

This disclosure relates to the field of electrical design and verification.

BACKGROUND

Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design of a layout and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product.

SPICE is a common type of simulator that is used to simulate and verify the operation of an electronic design. With SPICE, the electronic design is converted into a system of equation(s), which is then solved for a given set of inputs to check the state of specific portions of the circuit at given points in time. For many circuit designs, this process can be a very computationally expensive and time-consuming effort, especially given the size and complexity of modern circuit designs.

Even after simulation has occurred, further changes may still be introduced to the electronic design. For example, post-simulation layout edits may result in changes to the position and/or composition of components on the design layout. With these layout changes, there is usually also the need to perform another round of simulation on the new version of the design to check and account for the performance effects of those changes.

The problem is that even though the edits may occur in a limited manner to only a small percentage of the components and/or area of the overall layout, conventional approaches to implementing simulators such as SPICE may nonetheless require the entire design to be re-simulated. Because of the integrated nature of the system of equations created in SPICE for the circuit, post-layout edits will require the system of equations to be reformulated, and the entire circuit to then be re-simulated. This process incurs significant costs in terms of computational expense and time delays, even though much of the layout may have been entirely unchanged by the edits.

Therefore, there is a need for an improved approach to perform simulation that addresses these problems with the conventional approaches.

SUMMARY

Embodiments of the invention provide an improved method, system, and computer program product to perform post-layout simulation of an electronic design with layout editing. According to some embodiments, a circuit design is divided into multiple partitions for simulation. Simulation is then performed using the established partitions and results are obtained for the different partitions. When any layout editing occurs, identification can be made of any partitions that have been affected by the editing. The affected partitions are re-processed for simulation. The unaffected partitions do not necessarily need to be reprocessed. In this way, the efficiency of simulation after post-layout editing can be greatly improved.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Embodiments of the invention provide an improved method, system, and computer program product to perform post-layout simulation of an electronic design. According to some embodiments, a circuit design is divided into multiple partitions for simulation. Simulation is then performed using the established partitions and results are obtained for the different partitions. When any layout editing occurs, identification can be made of any partitions that have been affected by the editing. The affected partitions are re-processed for simulation. The unaffected partitions do not necessarily need to be reprocessed. In this way, the efficiency of simulation after post-layout editing can be greatly improved.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
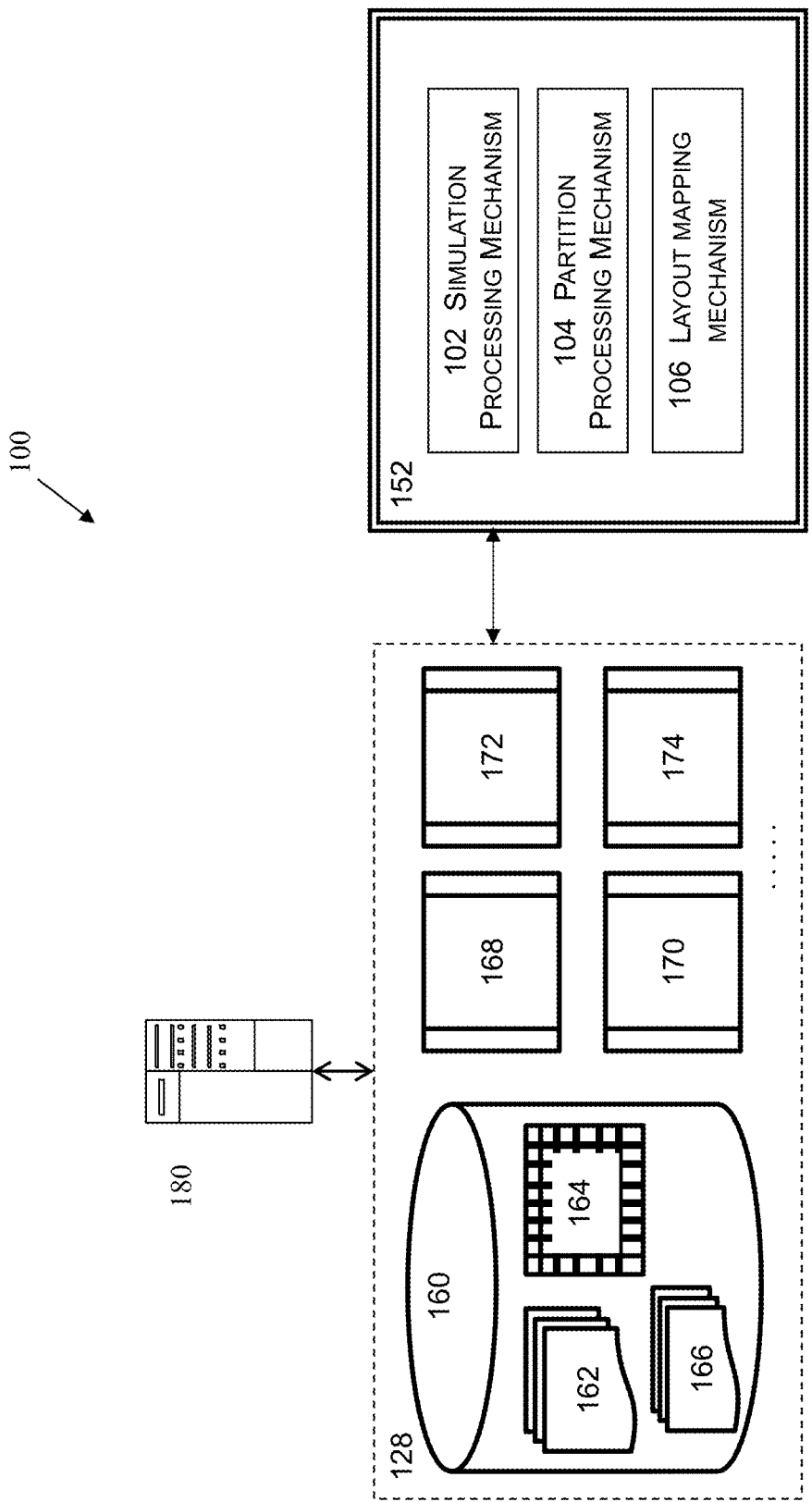
FIG. 1 shows an illustrative high level schematic block diagram for implementing post-layout edits and simulation of an electronic design according to some embodiments.
Figure 7:
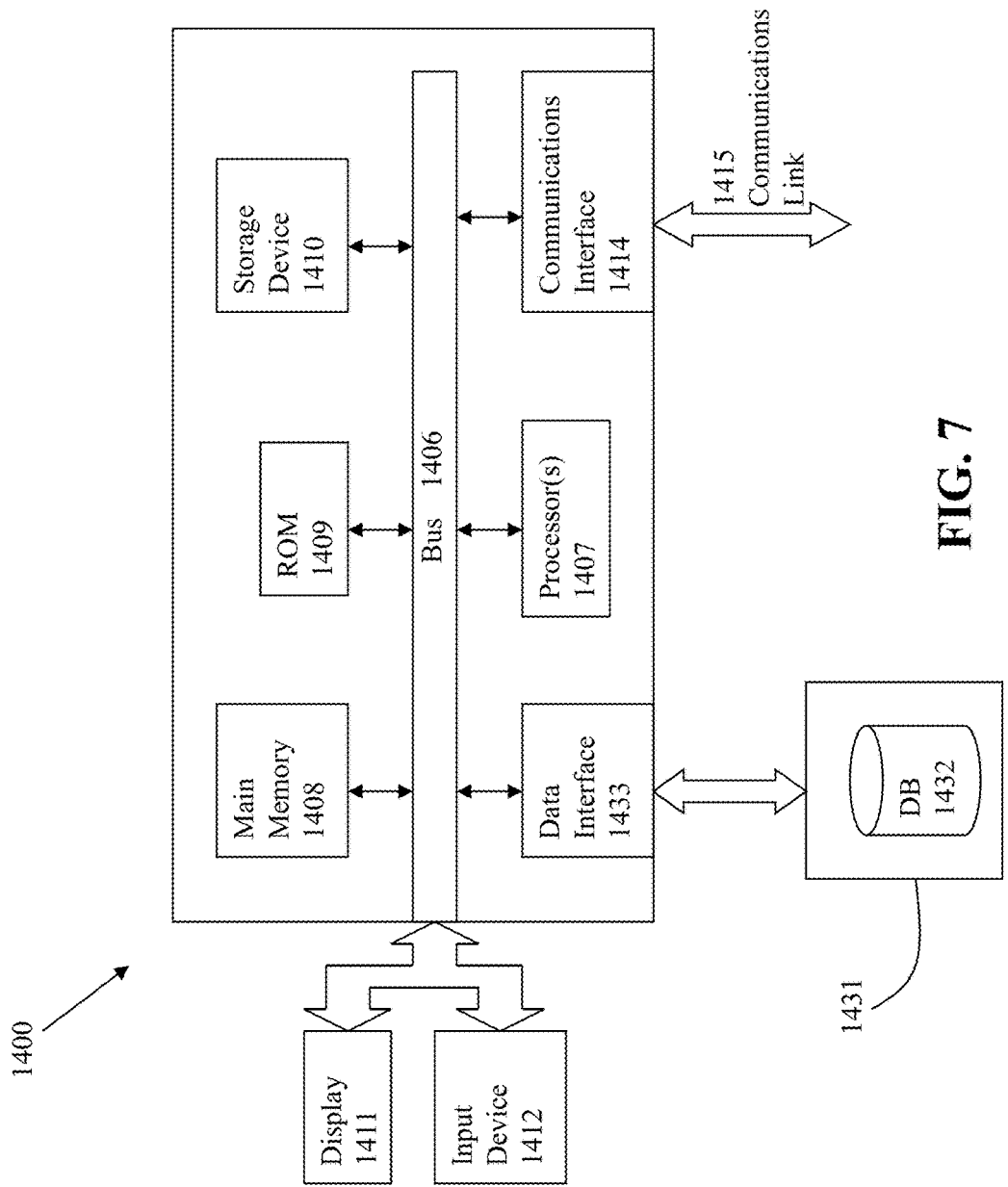
FIG. 7 depicts a computerized system on which some embodiments of the invention can be implemented.

FIG. 1 shows an illustrative high level schematic block diagram for implementing post-layout edits and simulation of an electronic design according to some embodiments, and may comprise one or more computing systems 100, such as a general purpose computer described with respect to FIG. 7. In some embodiments, the one or more computing systems 180 may invoke various system resources such as the processor(s) or processor core(s), memory, disks, etc. The one or more computing systems 100 may also initiate or interact with other computing systems to access various resources 128 that may comprise a routing engine 168 (e.g., global and/or detail routing engine), a layout editor 172, a design rule checker, a verification engine 170, parasitic extraction tool 174, etc.

The one or more computing systems 100 may further write to and read from a local or remote volatile or non-volatile computer accessible storage 160 that stores thereupon data or information such as, but not limited to, one or more databases (164) such as schematic design database(s) or physical design database(s), electronic circuit design specification database(s), various statistics, various data, rule decks, various design rules, constraints, etc. (162), or other information or data (166) that may be used to facilitate the performance of various functions to achieve the intended purposes.

In some embodiments, the one or more computing systems 100 may, either directly or indirectly through various resources 128 to invoke various software, hardware modules or combinations thereof in design environment 152 that may comprise a plurality of simulation processing modules or mechanisms 102 to perform simulation with multiple partitions. The design environment 152 may further include a partition processing module or mechanisms 104 to divide the circuit design into multiple partitions. The design environment 152 may also include a layout mapping module or mechanisms 106 to map portions of the layout to the partitions.

Figure 2:
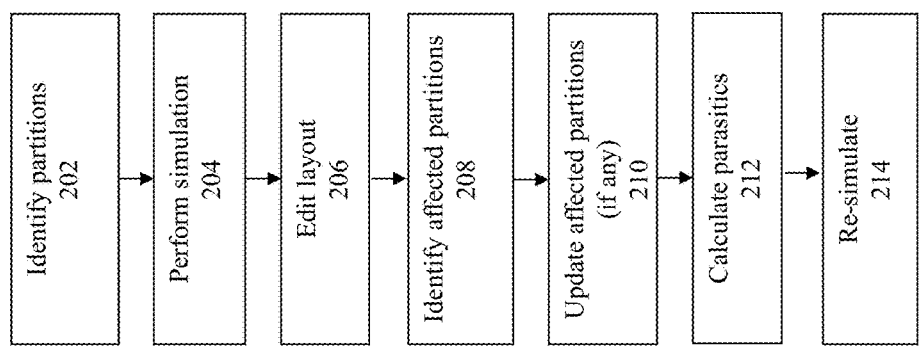
FIG. 2 shows a flowchart of an approach to implement post-layout edits and simulation of an electronic design according to some embodiments.

FIG. 2 shows a flowchart of an approach to implement post-layout edits and simulation of an electronic design according to some embodiments. In this approach, design partitions generated for simulation are mapped to the layout regions and then changes in these layout regions are tracked to incrementally change some or all partitions, which need to be simulated.

At 202, the circuit design is divided into multiple partitions. This may be implemented, for example, by using a Fast SPICE simulator to partition the design into multiple systems of equations, where each system of equation corresponds to a given partition. This is in contrast to conventional SPICE simulators that solves a single system of equations for the whole circuit. Next, at 204, an initial complete post layout simulation is performed for the design. To accomplish this, the linear equations are solved separately for each partition.

At 206, editing may occur to the layout, where one or more objects on the layout are changed. For example, one or more wires may be removed, re-routed, added, and/or moved to a different location. Similarly, one or more transistor objects may be added, removed, or relocated on the layout.

At 208, the portions of the layout affected by edits are mapped to one or more of the partitions. In some embodiment, this can be accomplished by having the design partitions back annotated to the layout to identify the different regions in the layout, which map to the simulation partitions. In a layout tool used for the editing process, once a given state of the layout is established as a reference, any changes performed upon the layout can be tracked to determine what region of the layout has changed since the last reference was established. When the layout is edited, the changes to design regions that map to the simulation partitions are communicated to the simulator. In some embodiments, an overcautious approach can be taken that is over-inclusive of the partitions to identify, so that any partition that is possibly affected would be identified for an update.

The simulator, at 210, then updates the partitions if necessary, where any updates are back annotated to calculate new partition regions. The partitions that need to be updated may include any partitions containing the specific objects that were changed by the layout editing. For example, a given partition may include a net having the specific wire and/or transistor instance that was changed by the layout editing. In this situation, it is highly likely that this partition will need to be updated. In addition, other partitions that would also be electrically affected by the layout edits may need to be updated, even if that partition does not include a wire or device instance that was directly changed by the layout edits.

Re-partitioning may occur for these affected partitions. One approach to implement this action is to take all of the affected partitions, and to then re-partition them as an entire group. For example, assume that the original design corresponds to 100 partitions. After layout editing, it is determined that 10 of the partitions need to be updated. In this situation, the individual content of the 10 identified partitions are grouped together into a general set or "blob" of content for re-partitioning.

It is noted that when the affected partitions are re-partitioned, it is possible that the number of partitions may change. For example, assume that two partitions (partitions 1 and 2) were identified as the affected partitions from the layout edits, and hence need to be updated. The updating process may end up with one large partition, two partitions as before, or even more than the original two partitions.

At 212, RC/parasitic extraction is performed upon the revised layout. This action calculates the parasitic effects of the wiring and device configuration based upon the post-edit version of the changed design. This is used to create an accurate analog model of the design for the later re-simulation process. In some embodiments, an in-design parasitic calculation engine is employed to perform the calculations after the layout edits.

At 214, re-simulation of the design is performed. In the present invention, simulation is performed only for the updated partitions identified as requiring the re-simulation, e.g., the updated partitions from 210. The unaffected partitions are not re-simulated. Instead, their simulation results from a previous simulation run are accessed for their respective simulation data. The results from simulating the updated partitions are combined with the previous results from the unaffected partitions to report the final simulation results. In some embodiments, a Fast SPICE simulator is employed to perform the simulation processing. An event driven, multi-rate simulation is performed, where at different times, the solution in a given partition is computed only if a change of state is anticipated due to changing input or load for this partition. The final solution is found by combining the result of simulation of partitions.

Figure 3:
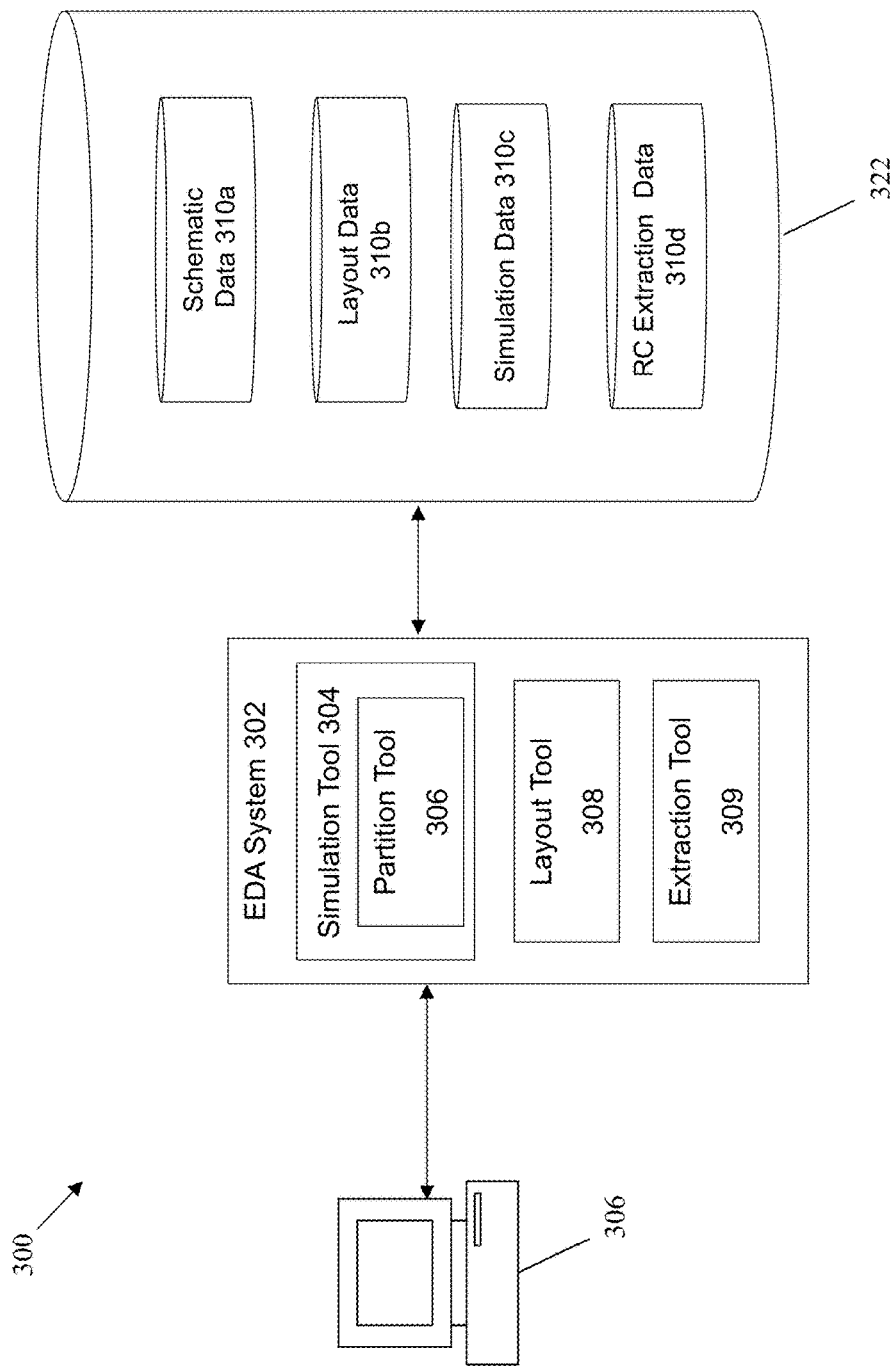
FIG. 3 illustrates an example system which may be employed in some embodiments of the invention to implement post-layout edits and simulation of an electronic design.

FIG. 3 illustrates an example system 300 which may be employed in some embodiments of the invention to implement post-layout edits and simulation of an electronic design. System 300 may include one or more users at one or more user station(s) 306 that operate the system 300 to design or verify the electronic design. Such users include, for example, design engineers or verification engineers. User station 306 comprises any type of computing station that may be used to operate, interface with, or implement EDA applications or devices, such as EDA system 302. Examples of such user stations 306 include for example, workstations, personal computers, or remote computing terminals. User station 306 comprises a display device, such as a display monitor, for displaying electronic design analysis results to users at the user station 306. User station 306 also comprises one or more input devices for the user to provide operational control over the activities of system 300, such as a mouse or keyboard to manipulate a pointing object in a graphical user interface.

The electronic design may be stored in a computer readable storage device 322. The electronic design corresponds to any form of electrical design data that needs to be processed by the EDA system 302. For example, the electronic design may include schematic data 310a or layout data 310b. In addition, electronic design data in medium 322 may also include simulation data 310c, including data created and/or used by the simulator 304 as well as simulation results data. The medium 322 may also contain extraction data 310d from operations of a parasitics extraction tool 309.

Computer readable storage device 322 includes any combination of hardware and/or software that allows for ready access to the data that is located at the computer readable storage device 322. For example, computer readable storage device 322 could be implemented as computer memory operatively managed by an operating system. The computer readable storage device 322 could also be implemented as an electronic database system having storage on persistent and/or non-persistent storage.

In some embodiments, some or all of schematic data 310a, layout data 310b, simulation data 310c, and extraction data 310d are stored in different, discrete systems, which may be databases specifically configured to store their respective data types.

In an alternative embodiment, some or all of schematic data 310a, layout data 310b, simulation data 310c, and extraction data 310d are stored into a centralized database. For example, Open Access (OA) is an example of a database standard that is commonly used by companies that create designs for integrated circuits (ICs) and other types electronic designs, where some or all of the data types can be centrally stored. By storing some or all of these data types in a central database, different electronic design automation (EDA) applications may more efficiently interact with the central database to store, retrieve, and access the data stored therein, and which therefore provides a vehicle for foundational interoperability of that data between the different types of EDA tools. More information regarding Open Access can obtained from the Silicon Integration Initiative, Inc. (Si2), an organization that promulgates standards for the EDA industry (www.si2.org).

One or more EDA tools may be used by users at a user station 306 to operate system 300. A simulation tool 304 may be provided to perform simulation activities within the system 300. The simulation tool 304 is employed to perform an initial complete post layout simulation for the design. After layout editing has occurred, the simulation tool is used to re-simulate any necessary partitions within the design, and to then combine the results for all partitions into final results. The simulation tool 304 may include a partition tool 306. The partition tool 306 establishes the different partitions within the electronic design.

The layout tool 308 is used to create and/or edit a layout for the electronic design. In some embodiments, the layout tool 308 corresponds to a custom layout editor that permits a designer to manually and/or automatically modify objects on a design layout.

The extraction tool 309 is employed to perform parasitic extraction upon the electronic design. This tool calculates the parasitic effects of the wiring and device configuration, and creates a model of the design that is sued by the simulation tool 304. In some embodiments, the extraction tool 309 corresponds to an in-design parasitic calculation engine.

Figure 4A:
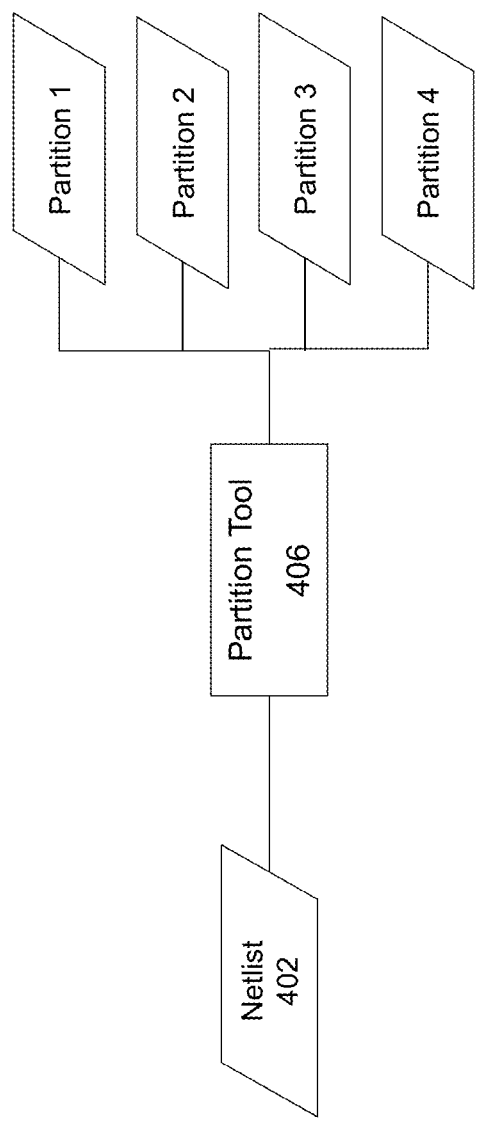
FIGS. 4A-H provides an illustration of the operation of the invention according to some embodiments.

FIGS. 4A-H provides an illustration of the operation of the invention according to some embodiments. FIG. 4A shows a netlist 402 that has been divided into multiple partitions 1, 2, 3 and 4. A partition tool 406 can be employed to the multiple partitions from the netlist. In some embodiments, a Fast SPICE simulator is used to generate the multiple partitions 1, 2, 3 and 4.

Figure 4B:
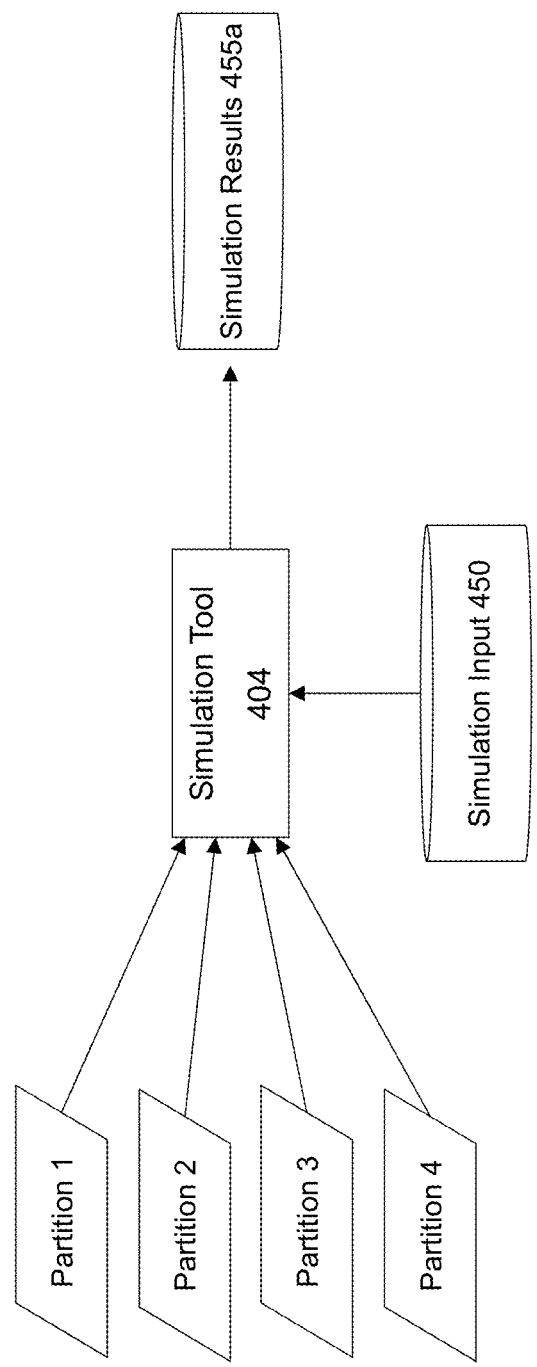

As shown in FIG. 4B, an initial complete post layout simulation can be performed for the design, where the simulator 404 receives simulation input 450 to perform the simulation. To accomplish this, the linear equations for the different partitions are solved separately by the simulator 404 for each of the partitions 1, 2, 3, and 4. The results for the different portions are combined together to form the simulation results 455a.

Figure 4C:
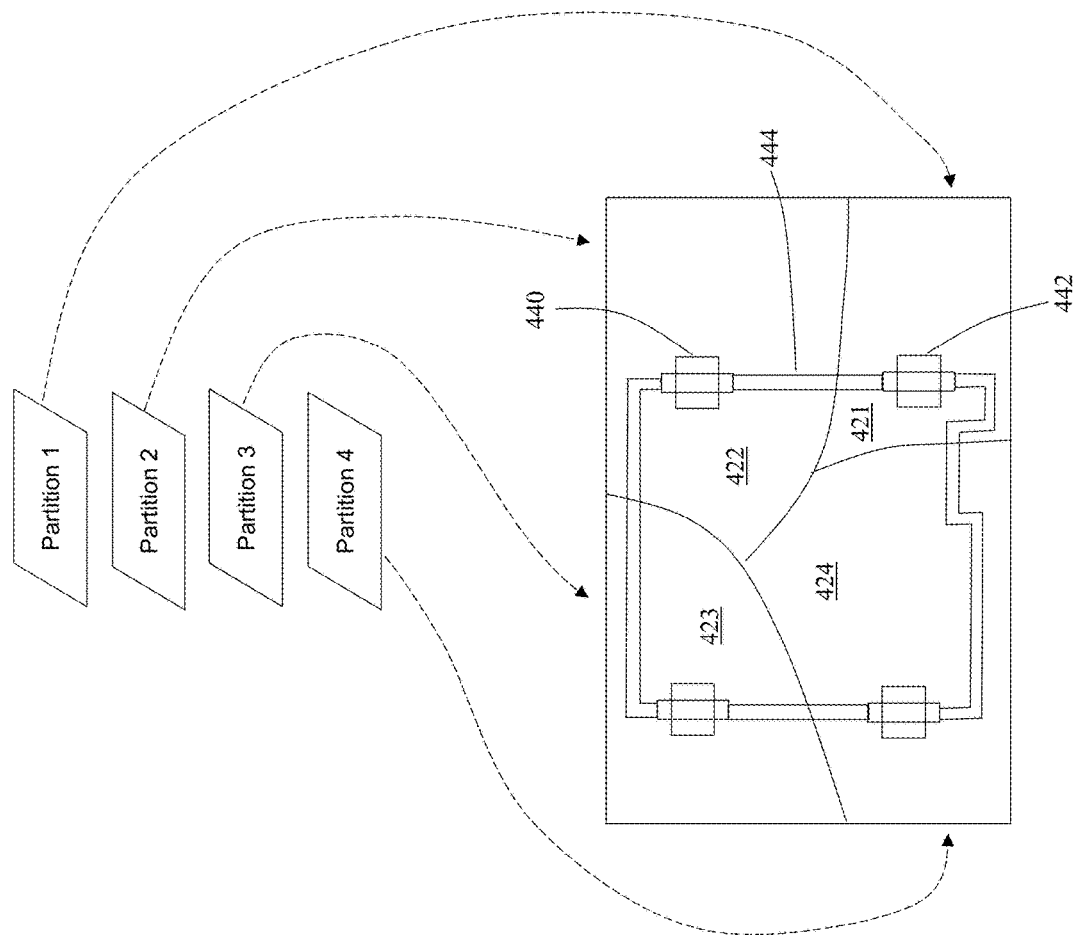

FIG. 4C shows how the partitions can be mapped to different portions of the physical layout of the electronic design. Here, partition 1 corresponds to layout portion 421, partition 2 corresponds to layout portion 422, partition 3 corresponds to layout portion 423, and partition 4 corresponds to layout portion 424.

Each of these layout portions includes one or more objects within the layout portions. For example, layout portion 421 includes a device instance 442 (e.g., a transistor object) within its boundaries. Similarly, layout portion 422 includes a device instance 440 within its boundaries. Certain objects may fall within multiple layout portions. For example, wiring structure 444 resides within both layout portion 421 and layout portion 422.

Figure 4D:
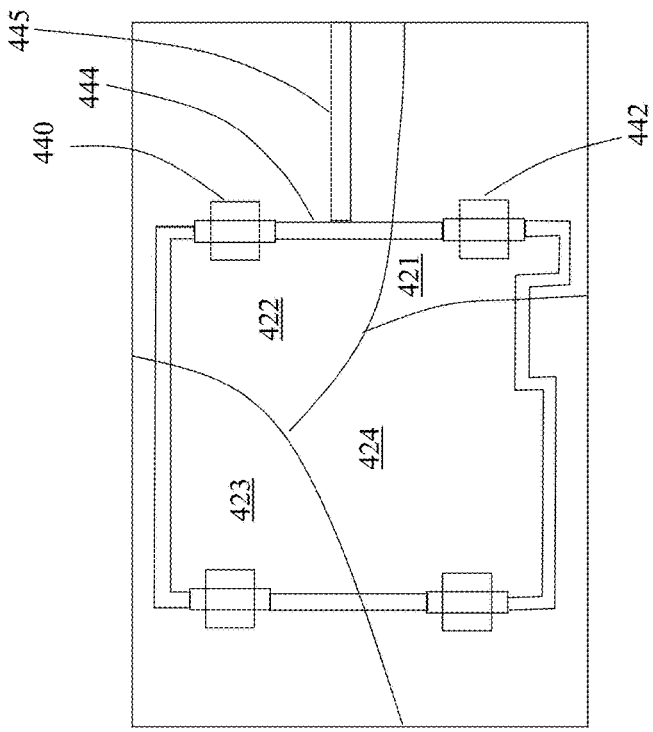
Figure 4D:
Figure 4D:
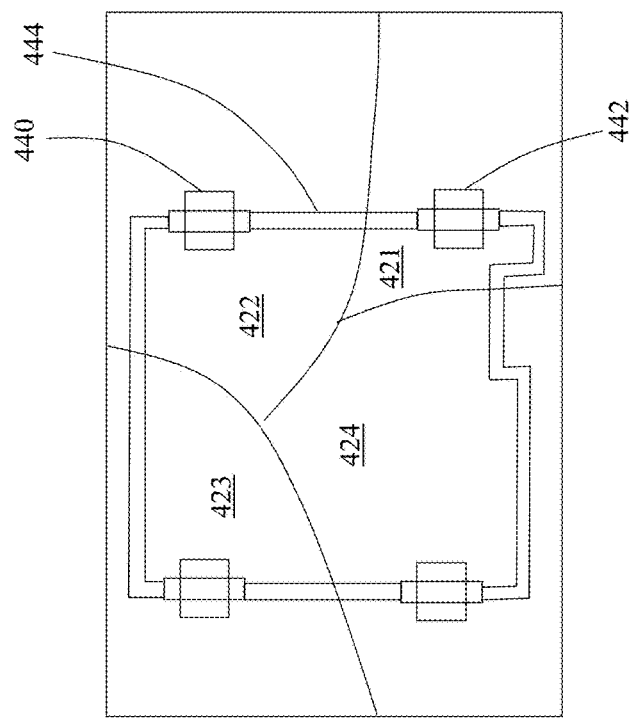

Post-simulation editing may occur at some point to the layout. FIG. 4D illustrates where editing has occurred to layout portion 422 such that an additional wiring object 445 now connects to the wiring structure 444.

Figure 4E:
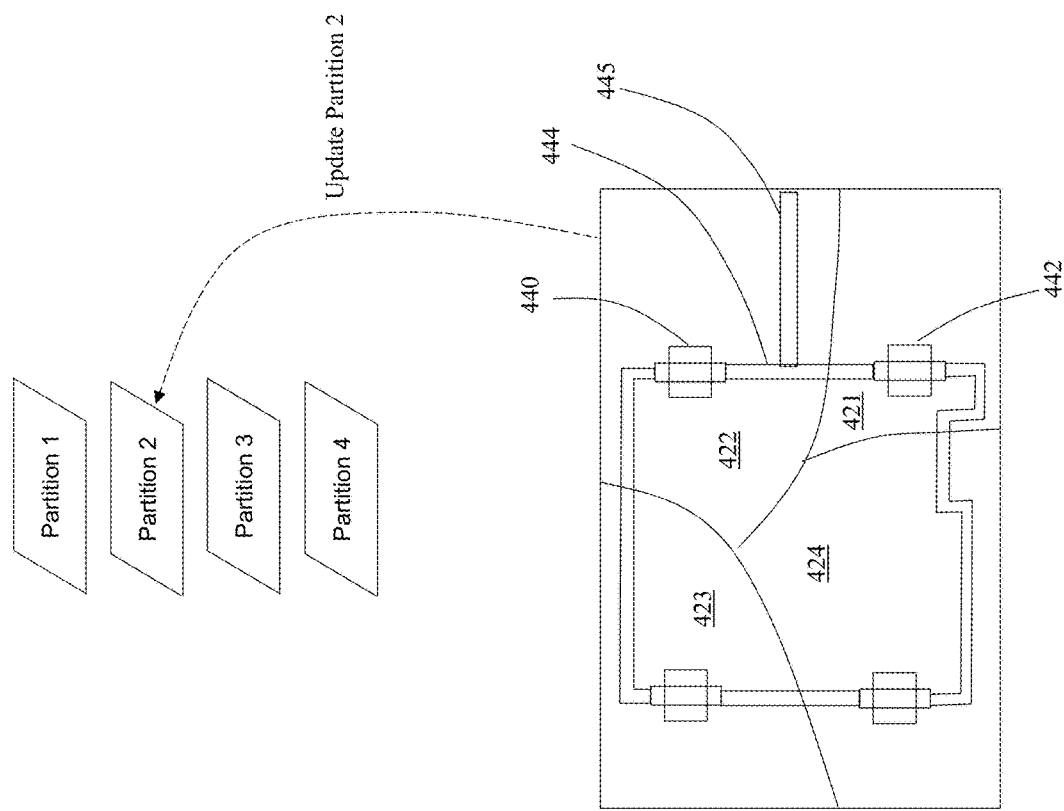

The next action is to determine which partitions have been sufficiently affected by the edits to the layout to require an update prior to re-simulation. In the current situation, layout portion 422 was directly changed by the layout edits, since this layout portion 422 now includes an additional wiring object 445. Layout portion 422 corresponds to partition 2. Therefore, as shown in FIG. 4E, partition 2 is identified as requiring an update.

Figure 4F:
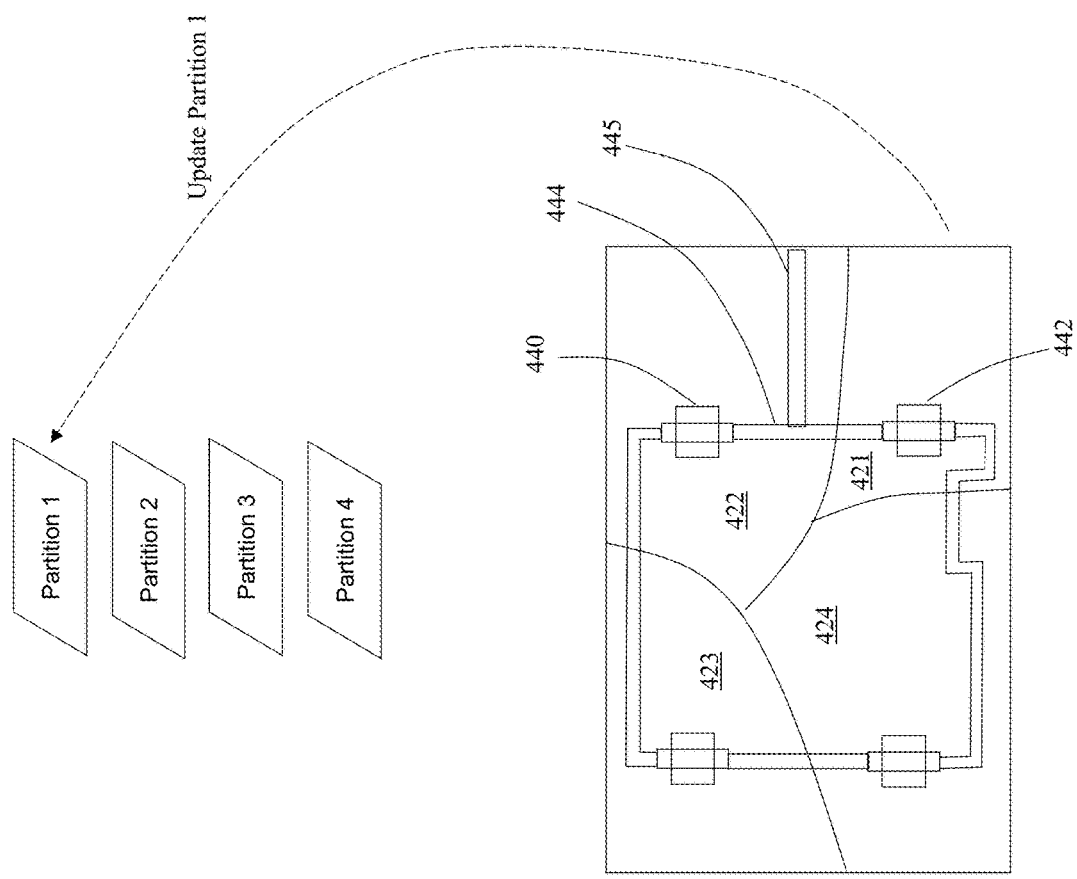

It is noted that the new wiring object 445 is in direct contact with existing wiring structure 444. This wiring structure falls within both layout portion 422 and 421. Therefore, it is likely that the layout editing to add object 445 into the layout will also affect the electrical characteristics of the components within layout portion 421. Layout portion 421 corresponds to partition 1. As such, as shown in FIG. 4F, partition 1 is also identified as requiring an update.

Figure 4G:
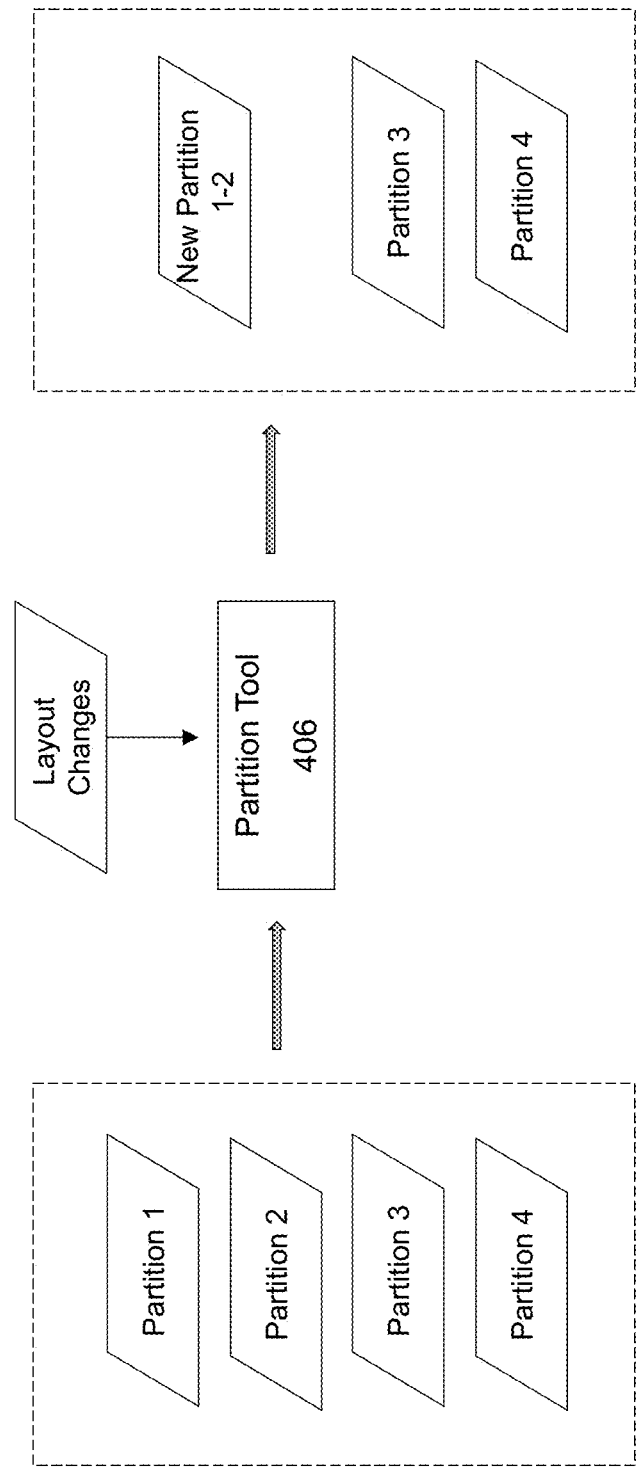

FIG. 4G illustrates the process to update partitions 1 and 2. As previously noted, when the affected partitions are re-partitioned, it is possible that the number of partitions may change. In the current example, it can be seen that when partitions 1 and 2 are updated, the updates resulted in a single new partition 1-2 being created. While this figure shows the re-partitioning of partitions 1 and 2 into a single new partition 1-2, the re-portioning process for a given electronic design may end up with any number of new partitions, depending upon the specific characteristics of the partitions and the layout changes. Therefore, this creation of new partition 1-2 shown in the figure is illustrative only, and not limiting to the scope of the invention.

Figure 4H:
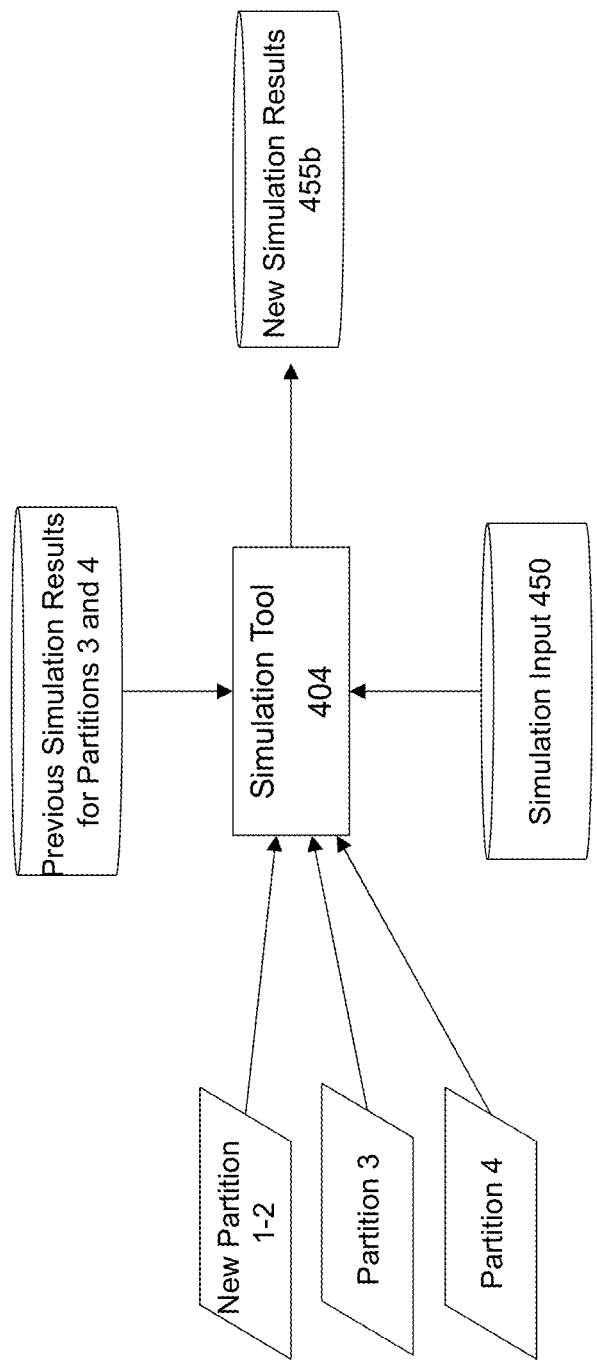

FIG. 4H illustrates the process to perform re-simulation on the design. Here, simulation is performed only for the updated partitions identified as requiring the re-simulation, e.g., the new partition 1-2. The unaffected partitions 3 and 4 are not re-simulated. Instead, the simulation results for partitions 3 and 4 from the previous simulation run of FIG. 4B are accessed and re-used for the current simulation. The results from simulating the new partition 1-2 are combined with the previous results from simulating partitions 3 and 4 to generate the final simulation results 455b.

Figure 5:
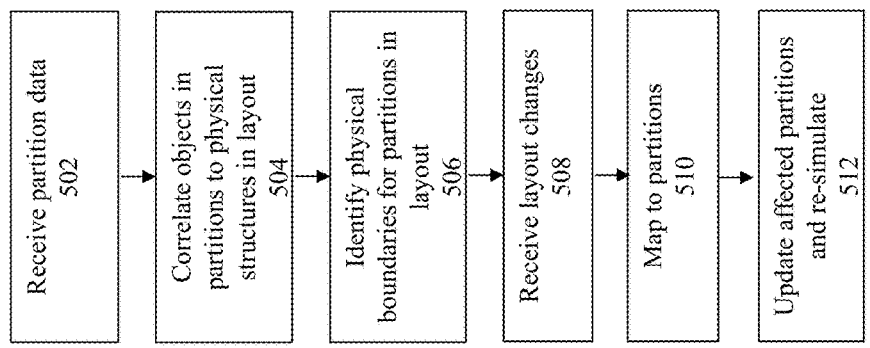
FIG. 5 shows a flowchart of a physical approach to correlate partitions to designated portions of the layout.

FIG. 5 shows a flowchart of a physical approach to correlate partitions to designated portions of the layout. This approach identifies actual physical boundaries in the layout for each partition, and identifies changed partitions due to correlations in changes to the layout within the physical layout boundaries for the affected partition(s).

At 502, the data regarding the different partitions is received. At 504, correlation is performed between the objects for a given partition and their physical representation in the layout. As noted above, the given partition corresponds to different portions of the overall netlist, where each of the net(s) within the given partition includes devices/structures and interconnections between those devices/structures. Those devices/structures are identified on the layout to identify the general area(s)/portion(s) of the layout for the given partition.

At 506, physical boundaries are then identified for the partition on the layout. One way to perform this action is to define an area that completely encapsulates the various devices/structures in the net(s) represented by the partition. In some embodiments, this means that overlapping boundaries may exist between adjacent partitions on the layout. If there is any "open" space left over on the layout that is not associated with a partition, then that open space may be assigned to a nearby partition, e.g., where it is assigned to a partition that has the greatest electrical-effects affinities for that layout portion or where the open space is simply equally divided among nearby partitions.

At 508, layout changes are received, e.g., based upon editing of the layout from a custom layout editing tool. At 510, those changes are mapped to the designated partitions, e.g., by checking whether the layout changes fall within the physical boundaries of one or more of the partitions. As previously noted, other partitions that would also be electrically affected by the layout edits may need to be updated, even if that partition does not include an object that was directly changed by the layout edits. Thereafter, at 512, the affected partitions are updated and a re-simulation process is performed.

Figure 6:
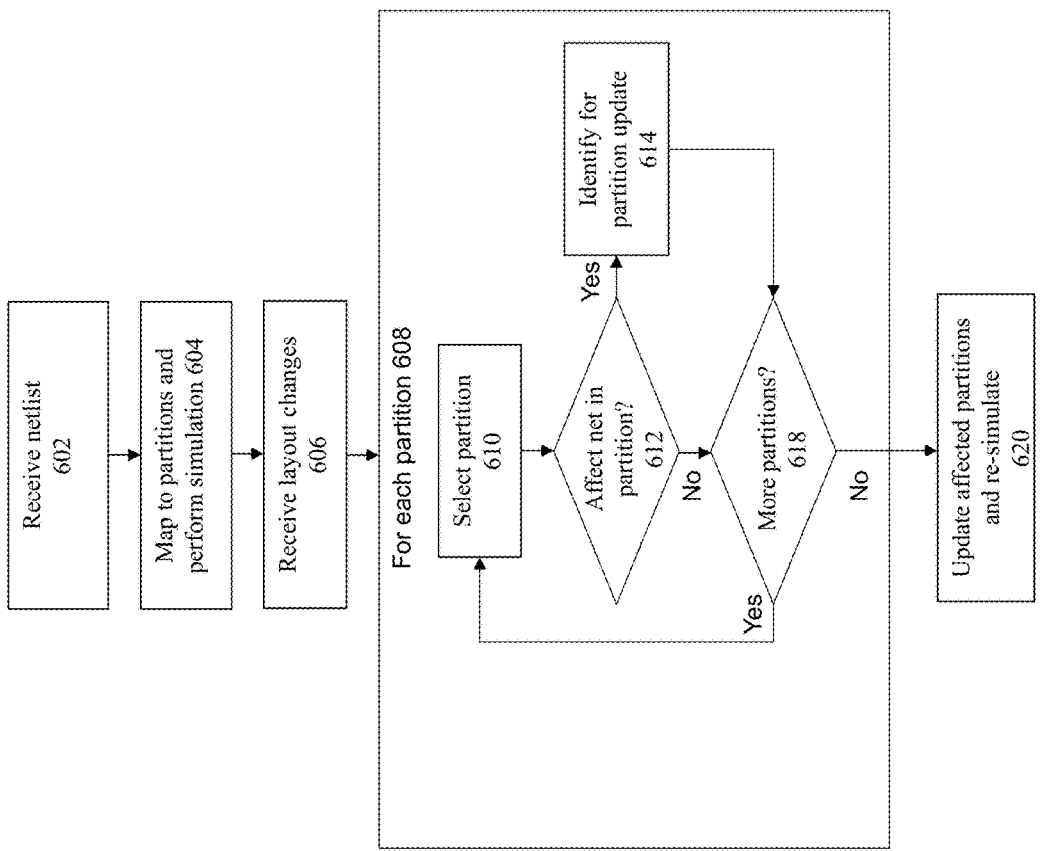
FIG. 6 shows a flowchart of an alternate approach that logically tracks changes in the layout to partitions, without necessarily needing to establish fixed physical boundaries for those partitions in the layout.

FIG. 6 shows a flowchart of an alternate approach that logically tracks changes in the layout to partitions, without necessarily needing to establish fixed physical boundaries for those partitions in the layout.

At 602, the netlist is received and, at 604, the circuit design is divided into multiple partitions and an initial complete post layout simulation is performed for the design. At 606, layout changes are received, e.g., based upon editing of the layout from a custom layout editing tool.

At this point, an attempt will be made to correlate the layout changes to specific partitions within the design. Processing 608 is performed for each identified partition to accomplish this task.

At 610, one of the partitions is selected for processing. A determination is made at 612 whether the layout change affected any net(s) corresponding to the partition. For example, if the layout edits made a modification to a structure in a net within a partition, then the determination at 612 is "Yes". Therefore, at 614, the partition would be identified for a partition update. Even in the absence of a specific structure in the net modified by the layout edits, the partition would be identified for an update if the partition would be otherwise electrically affected by the layout edits.

A determination is made at 618 whether there are any further partitions to process. If so, then the flow loops back to 610 to select another partition. If not, then the flow proceeds to 620, where the identified partitions are updated and a re-simulation process is performed.

Some embodiments may use a hybrid of these two techniques, where the logical approach of FIG. 6 is used to track changes caused by the layout edits, and the physical approach of FIG. 5 is used to identify specific objects/regions for display on a user interface.

Therefore, what has been described is an improved approach to perform post-layout simulation of an electronic design is provided, where a circuit design is divided into multiple partitions for simulation, and after layout edits, affected partitions are re-processed for simulation while unaffected partitions do not necessarily need to be re-simulated.

There are numerous useful applications for this invention. For example, consider the situation where an electronic design matches the criteria/specification specified as part of the simulation test bench after layout edits. With the current approach, the incremental post layout simulation is performed using the test bench specified in the simulation environment, and the results are then compared to the simulation criteria to make sure that result are within the specified tolerance limits. The criteria/spec, which has changed due to changes in the layout, can be highlighted in simulation environment. In addition, the region in the layout, which contributed to this change, can also be highlighted.

As another possible application, consider when the functionality of a part of the circuit has not changed due to changes in layout. In this situation, the simulation criteria/spec (such as rise time, propagation delay, frequency response etc.) may only specify critical measurement criteria, but they may not cover functionality of the whole design. It is possible that even though all the criteria specified in the simulation test bench are met, the circuit may not function as expected.

In this application the simulation results in a changed partition will be compared with the reference result to make sure that the various voltages and current waveforms have not changed more than the tolerance limits. If the change is more than the tolerance limit, then it will be flagged as a functionality failure and the region of the layout, which contributed to this failure, will be flagged.

System Architecture Overview

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor, comprising:
generating, by one or more microprocessors, previous simulation results at least by performing a simulation on a system of equations comprising a plurality of subsystems for determining behaviors of a circuit design, wherein the plurality of subsystems respectively correspond to a plurality of partitions of a simulation representation of the circuit design;
receiving, at a user interface via an input device, an input comprising one or more layout edits that modify at least one layout object in a layout corresponding to the circuit design;
in response to the one or more layout edits received at the user interface,
generating, by at least the one or more microprocessors, correlation results at least by determining one or more regions that correspond to one or more partitions affected by the one or more edits and further by identifying one or more subsystems that respectively correspond to the one or more partitions from the plurality of subsystems;
emphasizing, by at least the one or more microprocessors, the one or more regions in the layout with at least graphical emphasis in the user interface;
determining, by the one or more microprocessors, whether the one or more partitions are to be re-partitioned into one or more updated partitions based in part or in whole upon the correlation results; and
updating, at a partitioning module or module that is stored at least partially in memory and functions in tandem with the one or more microprocessors, the one or more partitions into the one or more updated partitions based in part or in whole upon the one or more layout edits, while leaving one or more unaffected partitions unchanged in at least one unaffected portion of the layout; and
determining, by the one or more microprocessors, behaviors of the circuit design with the one or more layout edits at least by:
determining a portion of the behaviors by performing at least one re-simulation with the one or more subsystems corresponding to the one or more updated partitions without performing re-simulations with at least one remaining subsystem that corresponds to the one or more unaffected partitions in the simulation representation; and
combining, by at least the one or more microprocessors, the portion of the behaviors with a remaining portion of the behaviors for the one or more unaffected partitions into combined behaviors for the circuit design, wherein
the remaining portion of the behaviors pertains to a corresponding portion of the previous simulation results for the at least one unaffected partition and is identified from a simulation database or a centralized database, without performing the re-simulations with the at least one remaining subsystem for the one or more unaffected partitions.

2. The method of claim 1, in which a FastSPICE simulator is employed to simulate the circuit design.

3. The method of claim 1, further comprising:
identifying at least one partition in which the one or more layout edits are not implemented to modify layout objects;

identifying the at least one partition into the one or more partitions;

grouping the one or more partitions into a group;

re-partitioning the group into the different number of partitions that has a first total number of partitions different from a second total number of partitions of the one or more partitions.

4. The method of claim 1, wherein the one or more partitions are updated by performing re-partitioning upon the one or more partitions.

5. The method of claim 1, wherein the previous simulation results for the at least one unaffected partition are combined with results from performing the at least one re-simulation on the one or more updated partitions to generate final simulation results.

6. The method of claim 1, wherein updating the one or more partitions to create the one or more updated partitions creates a different number of the one of more updated partitions from the one or more partitions that were updated.

7. The method of claim 1, where data for simulation and data for the layout are stored in a common database, and the common database is accessed to perform simulation and layout editing.

8. The method of claim 1, further comprising:

correlating one or more layout objects including the at least one layout objects in a partition of the one or more partitions to one or more corresponding physical representations in the layout; and associating one or more open spaces or one or more overlapping boundaries between at least two partitions of the plurality of partitions based at least in part upon physical boundaries in the layout for the plurality of partitions, distribution of open spaces, or electrical effect affinity of at least a portion of the layout.

9. The method of claim 1, wherein a plurality of boundaries is logically tracked for objects in nets that correlate to a respective partition.

10. A computer program product embodied on a computer readable medium, the computer readable medium having stored thereon a sequence of instructions which, when executed by a processor causes the processor to execute a method comprising:

generating, by one or more microprocessors, previous simulation results at least by performing a simulation on a system of equations comprising a plurality of subsystems for determining behaviors of a circuit design, wherein the plurality of subsystems respectively correspond to the plurality of partitions of a simulation representation of circuit design;

receiving, at a user interface via an input device, an input comprising one or more layout edits that modify at least one layout object in a layout corresponding to the circuit design;

in response to the one or more layout edits received at the user interface, generating, by at least the one or more microprocessors, correlation results at least by determining one or more regions that correspond to one or more partitions affected by the one or more edits and further by identifying one or more subsystems that respectively correspond to the one or more partitions from the plurality of subsystems;

emphasizing, by at least the one or more microprocessors, the one or more regions in the layout with at least graphical emphasis in the user interface;

determining, by at least the one or more microprocessors, whether the one or more partitions are to be re-partitioned into one or more updated partitions based in part or in whole upon the correlation results; and updating, at a partitioning module or module that is stored at least partially in memory and functions in tandem with the one or more microprocessors, the one or more partitions into the one or more updated partitions based in part or in whole upon the one or more layout edits to the layout, while leaving one or more unaffected partitions unchanged in at least one unchanged in at least one unaffected portion of the layout; and determining, by the one or more microprocessors, behaviors of the circuit design with the one or more layout edits at least by:

determining a portion of the behaviors by performing at least one re-simulation with the one or more subsystems corresponding to the one or more updated partitions without performing re-simulations with at least one remaining subsystem that corresponds to the one or more unaffected partitions in the simulation representation; and combining, by at least the one or more microprocessors, the portion of the behaviors with a remaining portion of the behaviors for the one or more unaffected partitions into combined behaviors for the circuit design, wherein the remaining portion of the behaviors pertains to a corresponding portion of the previous simulation results for the at least one unaffected partition and is identified from a simulation database or a centralized database, without performing the re-simulations with the at least one remaining subsystem for the one or more unaffected partitions.

11. The computer program product of claim 10, wherein previous simulation results for the at least one unaffected partition are combined with results from performing simulation on the one or more updated partitions to generate final simulation results.

12. The computer program product of claim 10, wherein updating the one or more partitions to create the one or more updated partitions creates a different number of the one of more updated partitions from the one or more partitions that were updated.

13. The computer program product of claim 10, wherein the plurality of partitions are correlated to physical boundaries in the layout.

14. A system for analyzing a circuit design, comprising:

one or more microprocessors; and a memory for holding programmable code, wherein the programmable code includes instructions which, when executed by the processor, causes the one or more microprocessors to:

generate, by at least one or more microprocessors, previous simulation results at least by performing a simulation on a system of equations comprising a plurality of subsystems for determining behaviors of a circuit design, wherein the plurality of subsystems respectively correspond to a plurality of partitions of a simulation representation of the circuit design, receive, at a user interface via an input device, an input comprising one or more layout edits that modify at least one layout object in a layout corresponding to the circuit design, in response to the one or more layout edits received at the user interface, the programmable code further includes instructions which, when executed by the processor, causes the one or more microprocessors to:

generate correlation results at least by determining one or more regions that correspond to one or more partitions affected by the one or more edits and further by identifying one or more subsystems that respectively correspond to the one or more partitions from the plurality of subsystems;

emphasize the one or more regions in the layout with at least graphical emphasis in the user interface;

determine whether the one or more partitions are to be re-partitioned into one or more updated partitions based in part or in whole upon the correlation results, update the one or more partitions into the one or more updated partitions based in part or in whole upon the one or more layout edits, while leaving one or more unaffected partitions unchanged in at least one unaffected portion of the layout, and determine, by at least the one or more microprocessors, behaviors of the circuit design with the one or more layout edits, wherein the one or more microprocessors executing the programmable code to determine the behaviors further execute the programmable code to:

determine a portion of the behaviors by performing at least one re-simulation with the one or more subsystems corresponding to the one or more updated partitions without performing re-simulations with at least one remaining subsystem that corresponds to the one or more unaffected partitions in the simulation representation; and combine, by at least the one or more microprocessors, the portion of the behaviors with the remaining portion of the behaviors for the one or more unaffected partitions into combined behaviors for the circuit design, wherein the remaining portion of the behaviors pertains to a corresponding portion of the previous simulation results for the at least one unaffected partition and is identified from a simulation database or a centralized database, without performing the re-simulations with the at least one remaining subsystem for the one or more unaffected partitions.

15. The system of claim 14, wherein the one or more partitions are updated by performing re-partitioning upon the one or more partitions.

16. The system of claim 14, wherein the previous simulation results for the at least one unaffected partition are combined with results from performing the at least one re-simulation on the one or more updated partitions to generate final simulation results.

17. The system of claim 14, wherein updating the one or more partitions to create the one or more updated partitions creates a different number of the one of more updated partitions from the one or more partitions that were updated.

18. The system of claim 14, where data for simulation and data for the layout are stored in a common database, and the common database is accessed to perform simulation and layout editing.

19. The system of claim 14, wherein the plurality of partitions are correlated to physical boundaries in the layout.

20. The system of claim 14, wherein a plurality of boundaries is logically tracked for objects in nets that correlate to a respective partition.

* * * * *